United States Patent [19]

Eby et al.

[11] Patent Number: 5,153,853
[45] Date of Patent: Oct. 6, 1992

[54] METHOD AND APPARATUS FOR MEASURING EEPROM THRESHOLD VOLTAGES IN A NONVOLATILE DRAM MEMORY DEVICE

[75] Inventors: Michael D. Eby, Battle Ground, Wash.; Katsumi Fukumoto, Nara, Japan; Michael J. Griffus; Giao N. Pham, both of Vancouver, Wash.

[73] Assignee: Sharp Kabushiki Kaisha, Japan

[21] Appl. No.: 585,772

[22] Filed: Sep. 20, 1990

[51] Int. Cl.$^5$ .............................................. G11C 7/00
[52] U.S. Cl. ........................... 365/185; 365/203; 365/201
[58] Field of Search .................. 365/185, 203, 189.09, 365/184, 201

[56] References Cited

U.S. PATENT DOCUMENTS 4,611,309 9/1986 Chuang et al. ....................... 365/185

Primary Examiner—Joseph A. Popek
Attorney, Agent, or Firm—Morrison & Foerster

[57] ABSTRACT

A method and apparatus for measuring threshold voltages associated with the EEPROM portion of a nonvolatile DRAM (NVDRAM) memory cell. The DRAM node of the NVDRUM cell is charged to a high potential and allowed to discharge through the EEPROM transistor. Since the gate of the EEPROM is tied to the DRAM node, the DRAM node voltage, which is also the EEPROM gate-to-source voltage, will, if the NVDRAM is left alone, drop until the EEPROM transistor shuts off. The EEPROM gate-to-source voltage at any point in time along this discharge path is measured through an iterative process. First, timing signals are adjusted to specify the point in time at which the EEPROM voltage is to be measured. Then, during each iteration, the EEPROM voltage is charged up and allowed to the discharge. At the point in time along the discharge path specified by the timing signals, a reference voltage is compared with the EEPROM voltage to determine if the reference voltage is above or below the EEPROM voltage. Over several such iterations, the reference voltage is adjusted closer and closer to the EEPROM voltage. The value of the reference voltage at the point where it crosses the EEPROM voltage is an approximation of the EEPROM voltage at the specified measuring time.

9 Claims, 6 Drawing Sheets

FIG. 4  RECALL

|  | Before Store | | After Store |
|---|---|---|---|
|  | DRAM | EEPROM | EEPROM |
| Case 1 - | 0 | 0 | 0 |
| Case 2 - | 0 | 1 | 0 |
| Case 3 - | 1 | 0 | 1 |
| Case 4 - | 1 | 1 | 1 |
|  | ↑ |  | ↑ |
|  | 620 |  | 610 |

METHOD AND APPARATUS FOR MEASURING EEPROM THRESHOLD VOLTAGES IN A NONVOLATILE DRAM MEMORY DEVICE

BACKGROUND OF THE INVENTION

This invention relates generally to an integrated memory device and, more specifically, to a method and apparatus for measuring threshold voltages associated with the EEPROM portion of a non-volatile DRAM (NVDRAM) memory cell.

An NVDRAM cell has been described in "A New Architecture for the NVRAM—An EEPROM Backed-Up Dynamic RAM", IEEE Journal of Solid State Circuits, Vol. 23, No. 1, February 1988; by Chuang et al. in U.S. Pat. No. 4,611,309; and in Yamauchi et al., "A Versatile Stacked Storage Capacitor on Flotox Cell for Megabit NVRAM Applications", from 1989 International Electron Devices Meeting Technical Digest, pages IEDM 89-595 through 598. These references are incorporated herein by reference.

A design related to that of the present invention is described in the article submitted herewith as Appendix A, entitled "A 256-bit Non-Volatile Dynamic RAM With ECC and Redundancy", by Fukumoto et al., which is incorporated herein by reference.

An NVDRAM cell includes a DRAM cell and an EEPROM cell. The DRAM cell, which typically consists of a MOS transistor in series with a storage capacitor, is volatile, while the EEPROM cell, which stores data in the form of charge on a floating gate in a floating gate MOS transistor, is non-volatile. The advantage of the NVDRAM is that while data may be quickly read from and written to the DRAM during normal operation, it can be stored in the non-volatile EEPROM during power down. The EEPROM data in an NVDRAM, however, is not directly accessible and must be transferred to the DRAM before being read.

An NVDRAM memory device, which includes a plurality of NVDRAM memory cells, has at least three operating modes: (1) a DRAM read/write mode in which the NVDRAM operates like a regular DRAM; (2) a store mode in which the DRAM data is transferred to the EEPROM to be stored; and (3) a recall mode in which the EEPROM data is transferred to the DRAM to be accessed.

In the DRAM read/write operating mode of an NVDRAM cell, the EEPROM transistor is turned off, and data is written to and read from the DRAM cell in the conventional manner—namely, the DRAM transistor is turned on when data is to be stored on or read from the DRAM storage capacitor, and otherwise is turned off.

When the DRAM data needs to be stored in the EEPROM, a store operation, which transfers the DRAM data to the EEPROM, is executed. The data is now stored as charge on the floating gate of the EEPROM transistor. When the EEPROM data needs to be recalled to the DRAM, a recall operation is executed. This operation consists of sensing the logic state of the EEPROM and, accordingly, charging a full logic state 1 or logic state 0 voltage level onto the DRAM storage capacitor.

In an integrated memory device, memory transistor threshold voltages are important indicators of the device's performance and reliability. A transistor's threshold voltage is the voltage at which the transistor starts conducting current after it has just been in a nonconducting state. The conducting and non-conducting states of a transistor, then, are associated with logic states 0 and 1, respectively, and the difference between the logic state 0 and logic state 1 thresholds is called the "window" of the transistor. A transistor with a smaller "window" is more likely to err as a result of random voltage swings, from noise, for instance, resulting in unintended logic swings. Hence, the size of this window is a measure of the memory transistor's reliability in differentiating signals corresponding to one logic state from those corresponding to the other.

In a floating gate EEPROM transistor, the threshold voltage may be "programmed" to different values by injecting different amounts of charge onto the floating gate. Thus, an excess of electrons on the floating gate of an EEPROM transistor, corresponding to a logic state of 1, causes a rise in the gate-to-source voltage necessary to turn on that transistor. Conversely, a lack of electrons on the floating gate, corresponding to a logic state of 0, results in a higher positive potential on the floating gate and a resulting decrease in the gate-to-source voltage necessary to turn on that transistor.

A transistor's window may vary over time. In floating gate EEPROM transistors, charge builds up over time, under normal operation, in the oxide region of the transistor—resulting in shrinkage of the window. Hence, the performance and reliability of an EEPROM memory transistor may be tracked over time by periodically measuring its logic state 0 and logic state 1 threshold voltages.

Transistors are typically biased to some normal operating point. If this operating point is too close to either the logic state 0 or logic state 1 threshold voltages, errors can occur from accidental turn-off or turn-on of transistors.

In addition, during normal operation, the EEPROM voltage is sensed, to determine its logic state, before it reaches its steady state threshold value. This means that a transistor's normal operating window, which is the difference between the actual EEPROM voltage when sensed as logic state 0 and that when sensed as logic state 1, is actually smaller than its total window as measured from its logic state 0 DC threshold to its logic state 1 DC threshold. Thus, measuring an EEPROM's gate-to-source voltages under normal biasing conditions provides information on the transistor's operating margin. The smaller the margin, the more likely it is that during normal operation, an EEPROM voltage, supposedly corresponding to a certain logic state, will be sensed as the opposite state.

Thus, it is desirable to know the threshold voltages of the memory transistors in a memory device in order both to provide for sufficient operating margins and to monitor the device's performance and reliability over time.

In a conventional EEPROM circuit (i.e. not in an NVDRAM), the EEPROM threshold voltage is easily determined, because the control gate of the EEPROM transistor is manipulable independently of the sensing circuitry which senses current through the EEPROM. First, the EEPROM may be programmed to either logic state 0 or logic state 1. Next, one node of the EEPROM transistor may be charged high in order to send current through the transistor. Then, the control gate voltage may be adjusted while monitoring current flow through the EEPROM. The control gate voltage at the point of current turn-off or turn-on is the threshold voltage programmed by the charge on the floating gate.

In an NVDRAM cell, however, the control gate of the EEPROM cell is tied to the source of the DRAM transistor. Since the operation of the sensing circuitry requires that the voltage at the source of the DRAM transistor be held at a certain level, and since the control gate of the EEPROM transistor is electrically tied to this level, it is not possible to independently manipulate the control gate voltage while, at the same time, enabling the sensing circuitry. Thus, the EEPROM threshold voltage may not be measured in the conventional manner.

SUMMARY OF THE INVENTION

Accordingly, it is an object of this invention to provide a method and apparatus for measuring gate-to-source voltages across an EEPROM floating gate transistor in an NVDRAM memory cell.

It is another object of this invention to provide such a method and apparatus for determining the threshold voltages of an EEPROM in an NVDRAM, corresponding to logic states 0 and 1, such that the size of the transistor's threshold voltage window may be determined and tracked over time.

It is yet another object of this invention to provide such a method and apparatus for determining the operating voltage margins and timing margins of an EEPROM under normal operating conditions such that the transistor's reliability and performance may be ascertained and tracked over time.

The present invention comprises method and circuitry for measuring the gate-to-source voltage across an EEPROM transistor in an NVDRAM memory cell. The method comprises precharging a reference bit line in a memory cell array to a reference voltage, precharging the DRAM cell in the NVDRAM to a high potential, letting the DRAM potential discharge toward ground through the EEPROM floating gate transistor, and sensing whether the DRAM voltage is above or below the reference voltage at a certain point in time. The DRAM voltage in an NVDRAM is equal to the gate-to-source voltage of the EEPROM.

Since the EEPROM threshold voltage corresponding to each logic state depends on the amount of charge stored on the floating gate, the DRAM voltage will decrease asymptotically towards whichever threshold voltage has been "programmed" onto the EEPROM. The DRAM voltage can then be compared to the reference voltage at any desired time during this discharge, by enabling sensing at that time. The sensing step reveals whether the DRAM voltage is above or below the reference voltage.

By varying the reference voltage over several iterations of this charging, discharging and sensing cycle, each time adjusting the reference voltage in the direction of the DRAM voltage, the method of the invention determines the value of the reference voltage at the point where it crosses over the DRAM voltage being measured. This crossover point is the point at which the sensing step reveals that the reference voltage is less than the DRAM voltage, where the reference voltage had previously been greater than the DRAM voltage; or, conversely, it is the point at which the sensing step reveals that the reference voltage is greater than the DRAM voltage, where the reference voltage had previously been less than the DRAM voltage. The value of the reference voltage at the crossover point approximates the value of the DRAM voltage; the smaller the reference voltage adjustments from iteration to iteration, the more precise the measurement.

The entire EEPROM voltage discharge path may be plotted out to the DC threshold limit by measuring the EEPROM voltage, using the iterative process described above, at different sensing times along the EEPROM voltage discharge path.

The method of the present invention is implemented in a fourth operating mode (in addition to the normal DRAM read/write mode, the store mode and the recall mode) of an NVDRAM device, namely a test mode.

DETAILED DESCRIPTION OF THE PREFERRED EMBODIMENTS

Figures 6, 7:
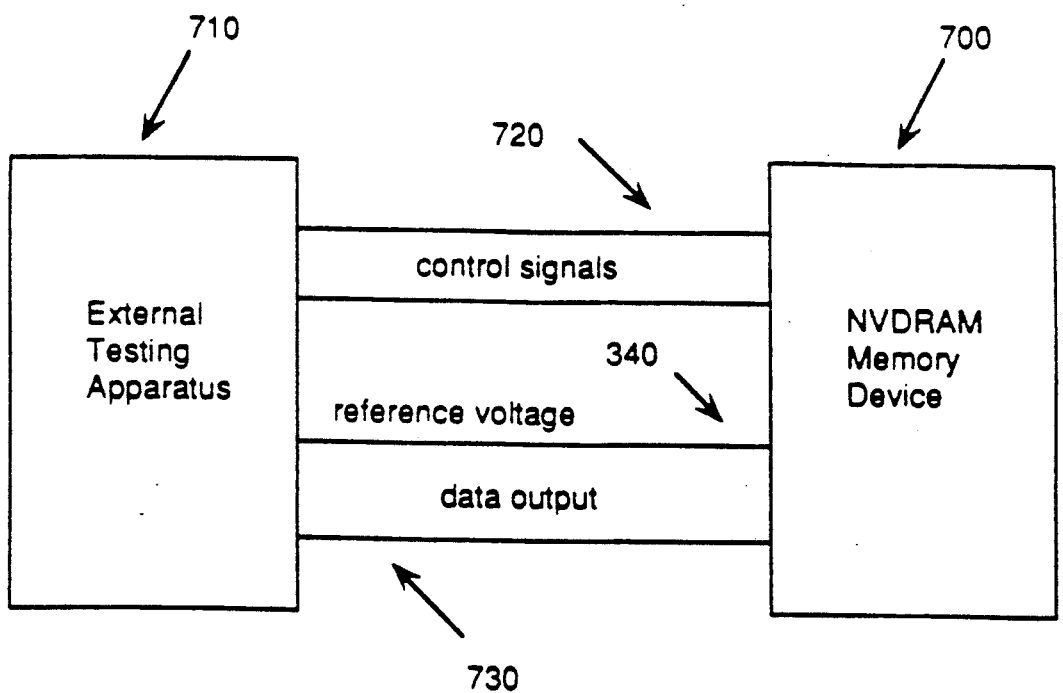
FIG. 6 is a state diagram for the store operation.
FIG. 7 is a top level diagram of an NVDRAM memory device connected to external testing apparatus.

FIG. 7 shows an NVDRAM memory device 700, including an array (to be discussed in reference to FIG. 2 below) of memory cells 200 to be tested, connected to an external testing apparatus 710, which may be a microcomputer or other conventional control and timing apparatus. Testing apparatus 710 controls the operating mode of memory device 700 (one mode of which is the test mode of the present invention) by passing to it control signals 720.

Figure 1:
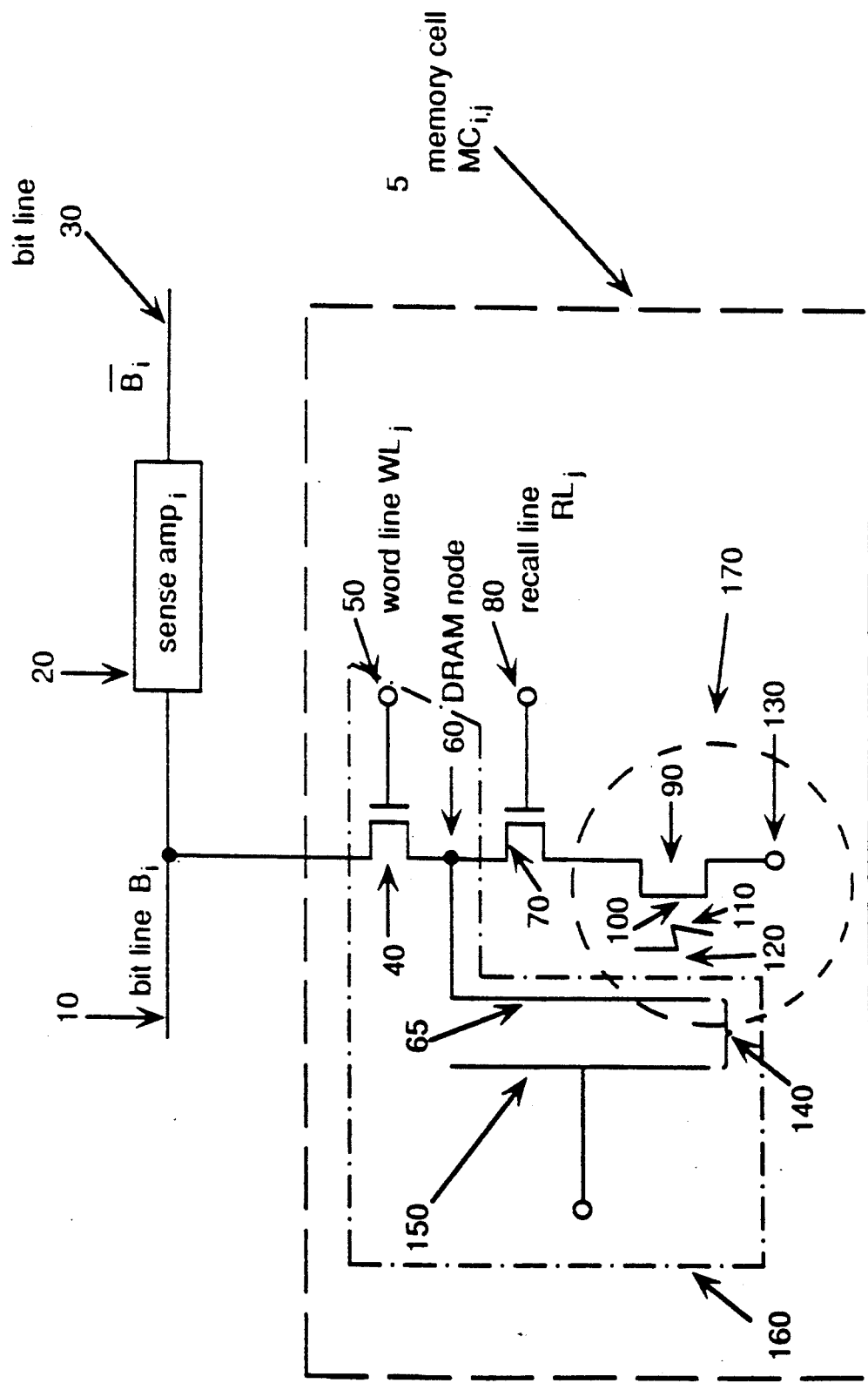
FIG. 1 is a circuit diagram of an NVDRAM memory cell of the invention.

FIG. 1 shows an NVDRAM memory cell ($MC_{i,j}$) 5 connected to a bit line ($B_i$) 10, which feeds into one end of a sense amplifier (sense $amp_i$) 20. (Memory cell 5 is designated $MC_{i,j}$ because it sits on the intersection of bit line i and word line j, as discussed in reference to FIG. 2 below.) Connected to the other end of sense amplifier 20 is a bit line ($B_i$-bar) 30. ($B_i$-bar is the complementary bit line to $B_i$, as discussed in reference to FIG. 2 below.)

Bit line 10 is connected to the drain of a DRAM transistor 40, whose gate is connected to a word line ($WL_j$) 50. The source end of DRAM transistor 40, which is labeled DRAM node 60, is connected to the drain of a recall transistor 70, whose gate is connected to a recall line ($RL_j$) 80. DRAM node 60 is also connected to the control gate 65 of an EEPROM transistor 90.

The source of recall transistor 70 is connected to EEPROM transistor 90. Transistor 90, which is a floating gate MOS transistor, includes a gate portion 100 comprising an oxide layer, a floating gate 110 and a capacitor 120 between floating gate 110 and EEPROM control gate 65. The source of EEPROM floating gate transistor 90 is labeled source 130.

EEPROM gate 65, which is connected to DRAM node 60, also serves as one side of a DRAM storage capacitor 140. A capacitor gate 150 serves as the other side of DRAM capacitor 140.

The DRAM portion 160 of NVDRAM memory cell 5 (surrounded by a dot-dashed line in FIG. 1) comprises DRAM transistor 40 in series with DRAM storage capacitor 140. The EEPROM portion 170 of NVDRAM memory cell 5 (surrounded by a dashed circle in FIG. 1) comprises EEPROM floating gate transistor 90. EEPROM data is stored as charge on floating gate 110.

Figure 2:
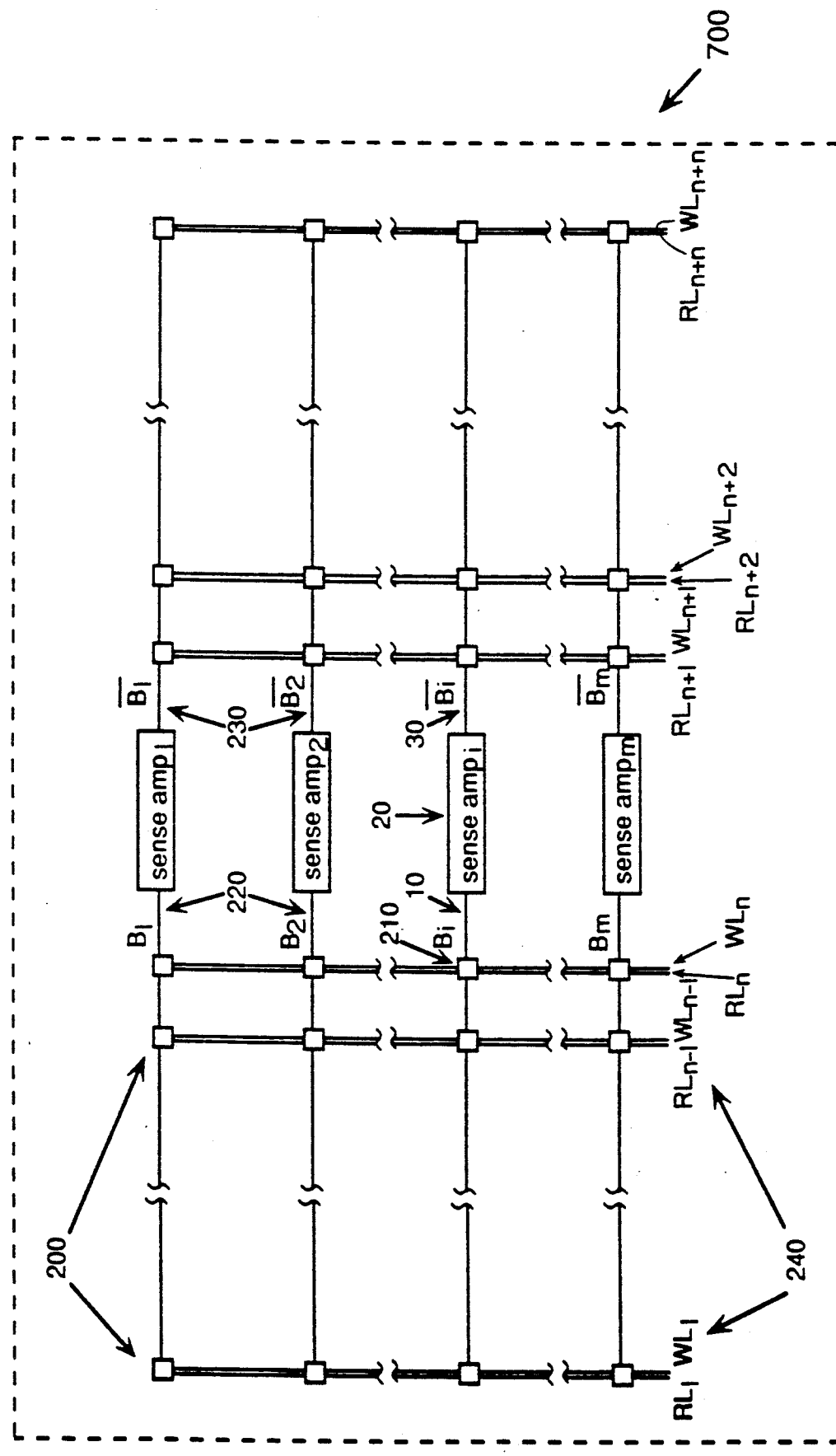
FIG. 2 is a connectivity diagram showing the logical configuration of NVDRAM memory cells in an NVDRAM memory device, according to the present invention.

FIG. 2 shows the logical connections of all of the memory cells 200 (which are identical to memory cell 5) in one embodiment of NVDRAM memory device 700 of the invention. In memory device 700, as detailed in FIG. 2, there are 2m bit lines 220 ($B_1$ through $B_m$ and $B_1$-bar through $B_m$-bar) and 2n word lines 240 ($WL_1$ through $WL_{n+n}$). Each bit line is connected to one end of a sense amplifier, whose other end is connected to the corresponding bit line-bar. For example, bit line ($B_i$) 10 is connected to one end of sense $amp_i$ 20, whose other end is connected to bit line ($B_i$-bar) 30.

Selecting one bit line and one word line selects the memory cell 200 at the intersection of these two lines. For example, selecting bit line $B_i$ and word line $WL_j$ selects memory cell ($MC_{i,j}$) 5 from FIG. 1. Selecting bit line $B_i$ and word line $WL_n$ selects memory cell ($MC_{i,n}$) 210 shown in FIG. 2.

Figure 3:
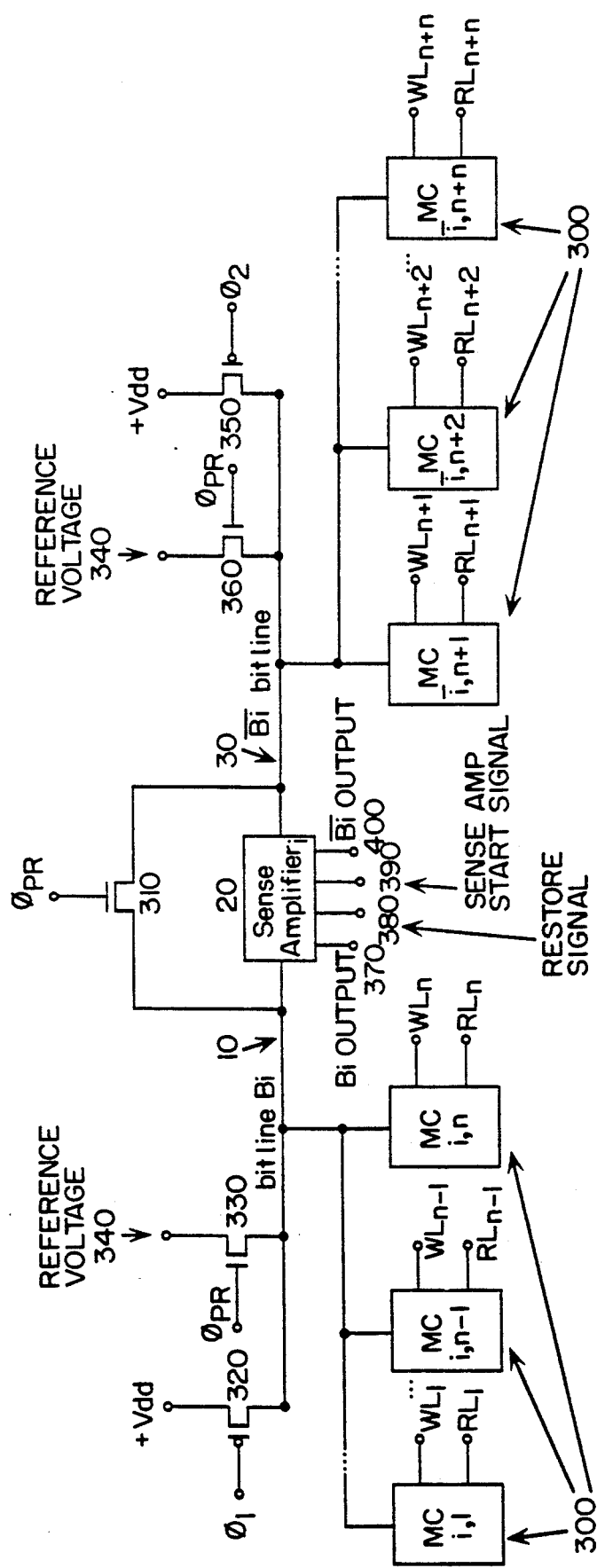
FIG. 3 is a block diagram showing individual NVDRAM cells connected to a bit line.

FIG. 3 is a close-up of memory cells 300 ($MC_{i,1}$ through $MC_{i,n+n}$) connected to bit lines ($B_i$) 10 and ($B_i$-bar) 30 in the memory array of FIG. 2. Bit lines 10 and 30 are connected to each other, through sense amplifier i (20) (which is the same as sense amplifier 20 shown in FIG. 1), via a transistor 310. Transistor 310 is turned on only during reference precharge in the recall and test operations in order to equalize the charges on bit lines 10 and 30. A transistor 320, which is turned on by voltage $\phi_1$, and a transistor 330, which is turned on by voltage $\phi_{PR}$, are connected to bit line 10 and are used to charge it either to +Vdd or to a reference voltage 340, respectively. Similarly, transistors 350 and 360, controlled by voltages $\phi_2$ and $\phi_{PR}$, are connected to bit line bar 30 and are used to charge it either to +Vdd or to a reference voltage 340, respectively. During normal operation, reference voltage 340 is $+\frac{1}{2}$ Vdd; however, it can be controlled externally within a range of values.

The NVDRAM memory cell 5 of FIG. 1 has four modes of operation: (1) the DRAM read/write mode; (2) the store mode; (3) the recall mode; and (4) the test mode. These modes, which are described in order below, are selected by sending different control signals 720 (see FIG. 7) from external testing apparatus 710 to memory device 700.

DRAM Read/Write Mode

In normal DRAM read/write operation, recall transistor 70 shown in FIG. 1 is turned off by setting recall line 80 low—electrically isolating EEPROM transistor 90 from the DRAM circuit 160. Capacitor gate 150 is grounded.

When memory cell 5 is selected by setting word line 50 high, DRAM transistor 40 is turned on, and one of two things occurs: either the data on bit line 10 is stored in DRAM storage capacitor 140, or the data previously stored in capacitor 140 is read out to bit line 10. DRAM read/write in memory cell 5 is carried out in a conventional manner for standard DRAM cells. The charged and uncharged states of DRAM storage capacitor 140 correspond to logic states 1 and 0, respectively.

Store Mode

As illustrated in FIG. 6, the store operation transfers the data in the DRAM to the EEPROM. Cases 1 through 4 in FIG. 6 show all of the possible starting logic states for DRAM cell 160 and EEPROM cell 170. In EEPROM transistor 90, logic state 0 manifests itself as a lack of electrons on floating gate 110. Hence, floating gate 110 is at a positive potential, sufficient to turn on EEPROM transistor 90 if source 130 were grounded. Conversely, logic state 1 manifests itself as an excess of electrons on floating gate 110. In this case, floating gate 110 is at a lower, non-conducting potential.

A logic state 1 for the DRAM may be defined as a (floating) high potential state, whereas a logical state 0 for the DRAM is a low potential state, essentially a floating ground. In general, the DRAM logic states correspond to the charge on the capacitor 140 (or the gate 65).

At the end of the store operation, logic state 610 of EEPROM cell 170 matches logic state 620 of DRAM cell 160. Hence, if capacitor 140 is uncharged before the store operation, there will be a lack of electrons on floating gate 110 after the store. If capacitor 140 is charged before the store, floating gate 110 will contain an excess of electrons after the store.

During the store operation, which includes two steps, recall line 80 is held low. First, capacitor gate 150 is grounded and source 130 is pulsed from 0 volts to +Vpp (approximately +13V in the preferred embodiment). Second, source 130 is grounded and capacitor gate 150 is pulsed from 0 volts to +Vpp. The effect of this operation, given various initial logic states on DRAM cell 160 and EEPROM cell 170, is as follows:

Case 1

Where DRAM cell 160 and EEPROM cell 170 are both in logic state 0, since floating gate 110 is at a higher potential from a lack of electrons, the source 130 pulse (i.e. grounding capacitor gate 150 and pulsing source 130) in the first step does not result in a large enough voltage difference from source 130 to floating gate 110 for tunneling of electrons through oxide 100 to occur. The charge on floating gate 110 is therefore unchanged after the first step.

The capacitor gate pulse in the second step (i.e. grounding source 130 and pulsing capacitor gate 150) couples a slightly higher voltage onto floating gate 110 through capacitors 140 and 120. But the resulting voltage, from floating gate 110 to source 130, is insufficient to cause tunneling across oxide 100, because DRAM node 60 was initially at ground. Thus, EEPROM cell 170 remains at logic state 0 after the store operation.

Case 2

Where DRAM cell 160 is at logic state 0 and EEPROM cell 170 is at logic state 1, since floating gate 110 is at a lower potential, the source pulse from the first step results in sufficient voltage across oxide 100 to induce tunneling of electrons from floating gate 110 to source 130. Thus, the excess electrons on floating gate 110, indicating a previous logic state of 1, are drained away, and EEPROM cell 170 now manifests a logic state of 0 (corresponding to the resulting lack of electrons on floating gate 110).

The capacitor gate pulse in the second step, however, is insufficient to cause tunneling across oxide 100 because DRAM node 60 is at a low potential. Although floating gate 110 is at a higher potential than before the first step, the increase in potential is not enough to allow tunneling. Therefore, EEPROM cell 170 remains at logic state 0 after the second step, with the net result that EEPROM cell 170 has been changed from logic state 1 before the store operation to the logic state 0 after the store operation.

Case 3

Where DRAM cell 160 is at logic state 1 and EEPROM cell 170 is at logic state 0, the source pulse in the first step is insufficient, as in Case 1, to cause tunneling.

However, since floating gate 110 and DRAM node 60 are now both at high potentials, the capacitor gate pulse in the second step couples a voltage (through capacitors 140 and 120) onto floating gate 110, which is sufficient to cause tunneling of electrons from source 130 to floating gate 110. Hence, after the store operation, the EEPROM contains logic state 1 (i.e., an excess of electrons).

Case 4

Where DRAM cell 160 and EEPROM cell 170 are both at logic state 1, the source pulse in the first step is insufficient to cause tunneling of electrons from floating gate 110 to source 130, because DRAM node 60 is at a high potential, thereby counteracting the effect of the pulse at source 130 on the charge on the floating gate 110. The charge on floating gate 110 is therefore unchanged after the first step.

The capacitor gate 150 pulse in the second step couples a higher potential onto floating gate 110 through capacitors 140 and 120. However, since floating gate 110 was still at a low potential after the first step, the higher potential coupled onto floating gate 110 by the capacitor 150 pulse is insufficient to induce tunneling across oxide 100. The charge on floating gate 110 is therefore unchanged after the second step as well. Floating gate 110 remains charged with excess electrons, corresponding to a logic state of 1.

Recall Mode

Figure 4:
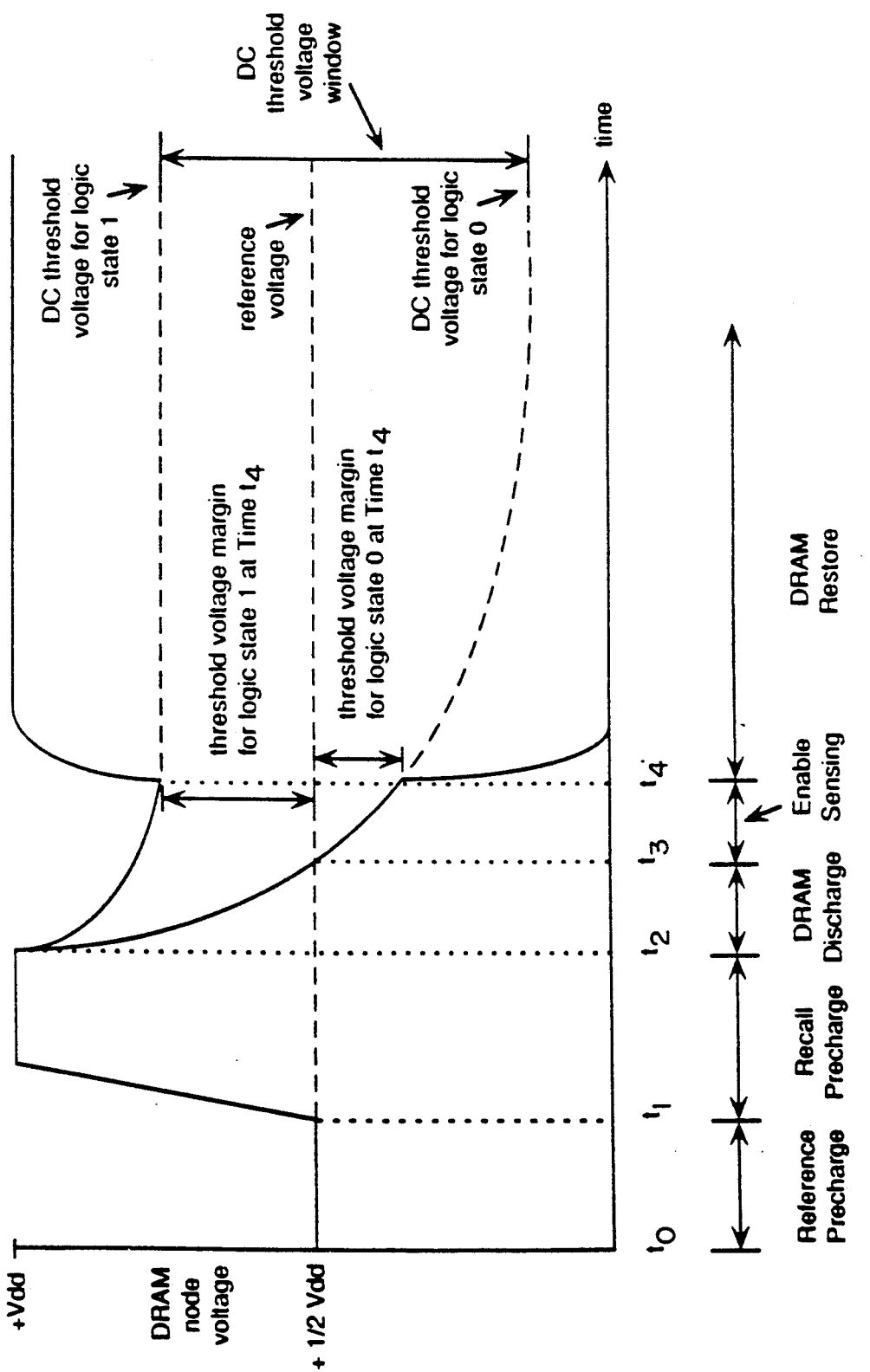
FIG. 4 is a plot of DRAM node voltage versus time during a recall or test operation.

In the recall operation, the data stored in EEPROM cell 170 are transferred to DRAM cell 160, where the data can be accessed. FIG. 4 is a plot of the voltage at DRAM node 60 versus time. During the entire recall operation, word line 50 is selected (i.e. set to a high voltage such that transistor 40 is turned on) and source 130 and control gate 150 are grounded.

From time $t_0$ to $t_1$ in FIG. 4, bit lines 10 and 30 are precharged to a reference voltage of $+\frac{1}{2}$ Vdd (for example, +2.5 V) through transistors 330 and 360, respectively (see FIG. 3). At time $t_1$, transistors 330 and 360 are turned off. Transistor 320 is turned on from $t_1$ to $t_2$ to precharge bit line 10 and DRAM node 60 to +Vdd (e.g. +5 V). At time $t_2$, transistor 320 is turned off, and recall transistor 70 is turned on (by setting recall line 80 high).

There now exists a path from DRAM node 60 to source 130. As a result, current starts flowing through EEPROM transistor 90 and the voltage at DRAM node 60 begins to drop.

Since DRAM node 60 also functions as gate 65 of EEPROM transistor 90, at some point, the voltage at DRAM node 60 will, if the circuit is left alone, drop sufficiently such that EEPROM transistor 90 shuts off—cutting off current flow and locking the voltage at DRAM node 60 at that value. The amount of charge on floating gate 110 determines the DRAM node 60 voltage at which this happens.

If there is a lack of electrons on floating gate 110 (resulting in a high potential and corresponding to logic state 0), the DRAM node 60 voltage must drop further to cause current shut-off than if floating gate 110 contains excess electrons. The higher the starting potential at floating gate 110, the lower the DRAM node 60 voltage must go in order to bring the voltage between floating gate 110 and source 130 below that which is required to turn on EEPROM transistor 90.

Thus, the DRAM node 60 voltage, starting at $t_2$, decreases asymptotically towards whichever DC threshold voltage was programmed onto floating gate 110. (Floating gate 110 is, as discussed above, programmed to either a logic state 0 threshold or a logic state 1 threshold by injecting onto it different amounts of charge.) At $t_3$, for logic state 0, the DRAM node 60 voltage drops below the reference voltage of $+\frac{1}{2}$ Vdd. Before the DRAM node voltage reaches the programmed DC threshold voltage level, sensing of the DRAM node 60 voltage is enabled at $t_4$. Sense amplifier 20 senses whether the DRAM node 60 voltage is above or below the $+\frac{1}{2}$ Vdd reference voltage. If above, sense amplifier 20 restores a full +Vdd level to DRAM node 60. If below, sense amplifier 20 sends DRAM node 60 to ground. This rail-to-rail (i.e. 0 to +Vdd) restore is necessary in order to counteract the degradation of the DRAM node 60 voltage, to its value at $t_4$, resulting from the sensing operation.

Test Mode

The test mode involves measuring the DRAM node 60 voltage at time $t_4$ in FIG. 4—$t_4$ being freely adjustable. Instead of just comparing the DRAM node 60 voltage once with a reference voltage of $+\frac{1}{2}$ Vdd, as in the recall operation, the test procedure adjusts the reference voltage over several iterations of the recall cycle. At each iteration, a new reference voltage is compared with the DRAM node 60 voltage at some given $t_4$. When the reference voltage finally crosses the DRAM node 60 voltage, sense amplifier 20 outputs a signal with a polarity opposite to that of the previous iteration. The value of the reference voltage upon this crossing is the value of the DRAM node 60 voltage at that time $t_4$.

Figure 5:
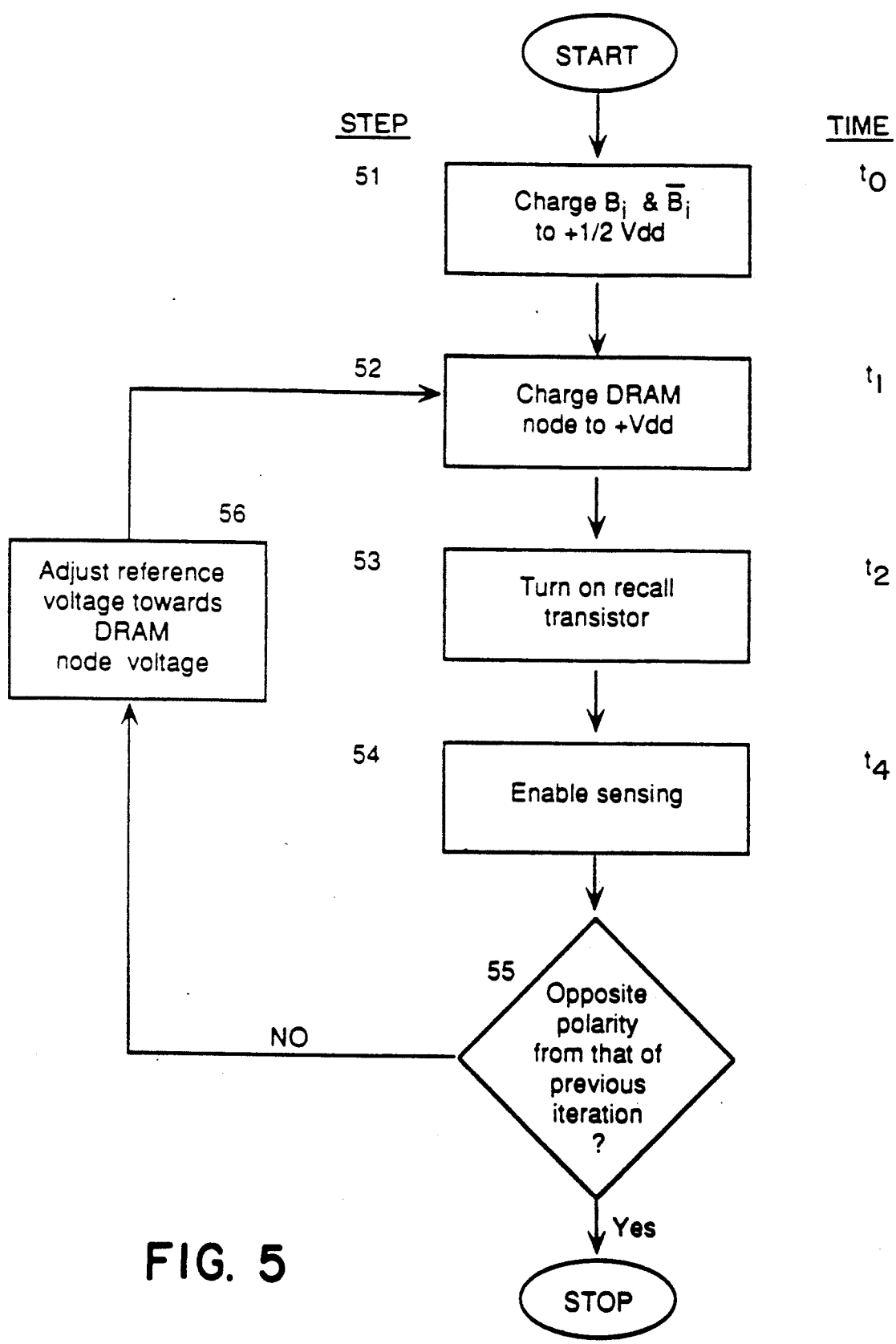
FIG. 5 is a flow diagram for the test operation.

FIG. 5 is a flow diagram of this iterative process. The times (i.e. $t_1$, $t_2$, etc) in FIG. 5 correspond to the similarly numbered times in FIG. 4. As in the recall operation, bit line 10 and reference bit line 30 are precharged to $+\frac{1}{2}$ Vdd at time $t_0$ (Step 51). At $t_1$ (Step 52), the beginning of recall precharge, DRAM node 60 is precharged to +Vdd. Then, recall transistor 70 is turned on at $t_2$ (Step 53). Sense amplifier 20 is enabled at $t_4$ (Step 54).

After sensing, in Step 55, testing apparatus 710 reads the output of sense amplifier 20 from $B_i$ output 370 and compares this with that output from the previous iteration. If a crossing (i.e. an opposite polarity) is sensed, the testing of this particular memory cell is finished. Otherwise, testing apparatus 710 adjusts the reference voltage (by a predetermined amount) closer towards the DRAM node 60 voltage and sends this new reference voltage into reference voltage input 340, in Step 56, and returns to Step 52 to perform another iteration.

Alternatively, instead of attempting to measure the DRAM node 60 voltage at $t_4$ precisely, pass/fail limits can be established and EEPROM transistor 90 can be tested against these limits. For example, the EEPROM 90 transistor could be programmed to logic state 1, and the reference voltage set to +3.5 V (one volt above +½ Vdd). In this case, if the DRAM node 60 voltage at $t_4$ is above the reference voltage, sense amplifier 20 senses a logic state of 1 and the transistor passes. If, however, the DRAM node 60 voltage at $t_4$ is below the reference voltage (for example, +3 V), sense amplifier senses a logic state of 0 and the transistor fails. The transistor's logic state 0 threshold may be similarly tested.

Other sorts of measurements may be performed. To determine the "time margin" of memory cell 5 under normal operating conditions (i.e. the difference between times $t_3$ and $t_4$ in FIG. 4 during normal operation), floating gate 110 is programmed to logic state 0 and sensing is enabled before time $t_3$ (which is when the DRAM node 60 voltage crosses +½ Vdd, or the normal operation reference voltage, for logic state 0). In effect, $t_4$ now comes before $t_3$. Sense amplifier 20 will now sense when the DRAM node 60 voltage crosses +½ Vdd, by making measurements at different times $t_4$—providing the value of $t_3$. Subtracting $t_3$ from the normal operating $t_4$ gives the time margin during normal operation for memory cell 5. If the time margin is too small, there is the danger that occasionally, sensing of a logic state 0 signal will accidentally be enabled before $t_3$—resulting in the possibility that sense amplifier 20 will sense and restore a full voltage of a polarity opposite from that desired.

In another application, $t_4$ may be held at the normal operating point and the reference voltage adjusted iteratively, as described above, in order to sense the DRAM node 60 voltage levels, for both EEPROM 90 logic states, at $t_4$. The differences between these voltage levels and +½ Vdd are the threshold voltage margins, for each logic state, during normal operation (i.e. at normal operation sensing time $t_4$). Although a large margin helps to prevent the accidental sensing of an incorrect logic state, increasing the time between crossing the reference ($t_3$) and enabling sensing ($t_4$) slows the operation of the memory circuit. Thus, margin information allows one to select $t_4$ and to alter the normal biasing conditions (including, possibly, altering the normal reference voltage away from +½ Vdd) such that an optimal balance is struck between reliability and speed.

In addition, $t_4$ may be moved, at successive iterations, forward in time such that the actual decay function of the DRAM node 60 voltage, as it approaches its steady state DC threshold voltage level, may be plotted. If $t_4$ is extended beyond the point where the decay function essentially flattens out (i.e. far to the right in FIG. 4), the DC threshold voltages of EEPROM transistor 90, corresponding to logic states 0 and 1, can be determined. The difference between these two DC thresholds is the EEPROM's total "window"—whose shrinkage may be measured over time. The larger the window, the easier it is to distinguish a logic state of 1 from a logic state of 0.

As an example of a test operation with reference to FIG. 3, assume that bit line 10 contains the memory cell to be recalled. This cell is selected by setting the appropriate word line high; thus, to select memory cell $MC_{i,n}$ from memory cells 300, word line $WL_n$ is set high. During reference precharge, from time $t_0$ to time $t_1$ in FIG. 4, bit lines 10 and 30 are precharged to +½ Vdd, through transistors 330 and 360. Transistor 310 is turned on during this precharge, to equalize the voltages on bit lines 10 and 30, and is then turned off at $t_1$.

Beginning at $t_1$, bit line 10 is charged from +½ Vdd to +Vdd while bit line (Bi-bar) 30, the reference bit line, remains at +½ Vdd. At $t_2$, recall line $RL_n$ is selected. The DRAM node (such as DRAM node 60 in FIG. 1) in $MC_{i,n}$ now starts discharging through its corresponding EEPROM transistor (see EEPROM transistor 90 in FIG. 1). At $t_4$, sense amplifier 20 is enabled by sending a sense amplifier start signal into input 390. The DRAM node voltage in $MC_{i,n}$ is now compared with the reference voltage on bit line 30 and railed to either +Vdd or ground by sending a restore signal into restore input 380.

The full rail voltage also appears on $B_i$ output 370. The complemented full rail voltage appears on $B_i$-bar output 400. The $B_i$ output 370 voltage is buffered to generate data output 730 (see FIG. 7), which feeds into the portion of memory testing apparatus 710 that is responsible for comparing that voltage against the result from the previous iteration (Step 55 in FIG. 5). Memory testing apparatus 710 is also responsible for setting a new reference voltage value, which is input into reference voltage input 340, for use in the next iteration (Step 56).

Thus, memory testing apparatus 710 tests memory cells 200 in NVDRAM memory device 700 to ensure that the cells 200 operate with sufficient voltage and timing margins to prevent logic errors due to memory device 700. In addition, by periodically testing cells 200, their reliability and performance may be monitored over time.

What is claimed is:

1. A method for measuring gate-to-source voltages across an EEPROM cell in an NVDRAM cell comprising a DRAM cell having a DRAM transistor, and the EEPROM cell having an EEPROM transistor, wherein a source of the DRAM transistor is electrically connected to a gate of the EEPROM transistor, including the steps of:

(1) precharging a reference line electrically coupled to a drain of said DRAM transistor to a reference voltage;

(2) precharging the source voltage of the DRAM transistor to a high voltage;

(3) turning on the EEPROM transistor such that the DRAM transistor source voltage discharges toward ground, through the EEPROM transistor, and approaches an EEPROM gate-to-source voltage value at which the EEPROM transistor turns off; and (4) at a predetermined time, determining which one of the reference voltage and the DRAM transistor source voltage is higher.

2. The method of claim 1, further including the step of:

(5) repeating steps 1 through 4 and, at each repetition thereof, adjusting the reference voltage in the direction of the DRAM transistor source voltage, until the reference voltage goes from being less than to greater than, or goes from being greater than to less than the DRAM transistor source voltage from a previous iteration of steps 1 through 4.

3. The method of claim 2, including the further step of:

(6) repeating step 5, at each repetition thereof varying the predetermined time at which step 4 is carried out.

4. The method of claim 2, wherein a DC threshold voltage on the gate of the EEPROM transistor is measured by setting the predetermined time at which step 4 is carried out to a time after the DRAM transistor source voltage has reached a steady state value.

5. The method of claim 1, wherein the method further constitutes a method for determining a time margin for the NVDRAM cell, wherein the predetermined time of step 4 is selected to be at a time before the DRAM transistor source voltage has dropped to the reference voltage.

6. The method of claim 1, the method further constituting a method for determining a total window for the EEPROM cell, wherein the predetermined time at which step 4 is carried out is set at a time after the DRAM transistor source voltage has reached a steady state value, further including the steps of:
  (5) carrying out steps 1 through 4 for each of a first logic state and a second logic state for the EEPROM transistor gate, for determining a first threshold voltage corresponding to the first logic state and a second threshold voltage corresponding to the second logic state; and
  (6) determining a difference between the first threshold voltage and the second threshold voltage.

7. A method for determining a threshold voltage margin of an NVDRAM cell comprising a DRAM cell having a DRAM transistor and an EEPROM cell having an EEPROM transistor, wherein a source of the DRAM transistor is electrically connected to a gate of the EEPROM transistor, including the steps of:
  (1) setting the EEPROM transistor gate to a first logic state;
  (2) precharging a reference line to a reference voltage;
  (3) precharging the DRAM transistor source voltage to a high voltage;
  (4) turning on the EEPROM transistor such that the DRAM transistor source voltage discharges toward ground, through the EEPROM transistor, and approached an EEPROM gate-to-source voltage value at which the EEPROM transistor turns off;
  (5) at a predetermined time, determining which one of the reference voltage and DRAM transistor source voltage is higher;
  (6) repeating steps 2 through 5, wherein for each repetition step 2 is carried out by charging the reference line to a different reference voltage than for a previous iteration of steps 2 through 5;
  (7) determining a first threshold voltage for the first logic state by determining when the reference voltage goes from being less than to greater than the DRAM transistor source voltage from the previous iteration;
  (8) setting the EEPROM gate to a second logic state;
  (9) repeating steps 2 through 6 for the second logic state, and determining a second threshold voltage for the second logic state by determining when the reference voltage goes from being greater than to less than the DRAM transistor source voltage from the previous iteration; and
  (10) determining the difference between the first threshold voltage and the second threshold voltage.

8. An apparatus for determining a threshold voltage of an NVDRAM cell comprising a DRAM cell having a DRAM transistor and an EEPROM cell having an EEPROM transistor, wherein a source of the DRAM transistor is electrically connected to a gate of the EEPROM transistor, comprising:
  means for setting the EEPROM transistor gate to a first logic state;
  a reference line for being charged to a reference voltage;
  means for precharging a source of said DRAM transistor to a high voltage;
  means for discharging the source voltage of said DRAM transistor after said source has been precharged; and
  a sense amplifier connected to said reference line and to said DRAM transistor for determining at a given time whether said DRAM source voltage has gone from being greater than to less than said reference voltage, for determining a first threshold voltage.

9. The apparatus of claim 8, wherein the setting means is also for setting the EEPROM transistor gate to a second logic state and the sense amplifier is also for determining a second threshold voltage by determining at said given time whether said DRAM transistor source voltage has gone from being less than to greater than said reference voltage, the apparatus further including means for determining a difference between the first threshold voltage and the second threshold voltage for determining a threshold voltage margin.

* * * * *